(12) United States Patent
Farbiz et al.

(10) Patent No.: US 8,633,541 B2
(45) Date of Patent: Jan. 21, 2014

(54) DIODE ISOLATED DRAIN EXTENDED NMOS ESD CELL

(75) Inventors: Farzan Farbiz, Dallas, TX (US); Akram A. Salman, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 47 days.

(21) Appl. No.: 13/339,020

(22) Filed: Dec. 28, 2011

(65) Prior Publication Data

US 2012/0161232 A1 Jun. 28, 2012

Related U.S. Application Data

(60) Provisional application No. 61/427,709, filed on Dec. 28, 2010.

(51) Int. Cl.
*H01L 27/06* (2006.01)

(52) U.S. Cl.
USPC ........... 257/337; 257/288; 257/341; 257/484; 257/500; 257/E27.016

(58) Field of Classification Search
USPC ......... 257/337, 500–502, 495, 484, 341, 288, 257/E21.417, E27.016
See application file for complete search history.

(56) References Cited

U.S. PATENT DOCUMENTS

| 6,869,840 | B2 * | 3/2005 | Chatterjee et al. | ............ 438/238 |
| 2005/0286186 | A1 * | 12/2005 | Chang | .............................. 361/56 |
| 2008/0001168 | A1 * | 1/2008 | Manna et al. | ................. 257/173 |
| 2011/0006341 | A1 * | 1/2011 | Sawahata | ...................... 257/143 |

\* cited by examiner

*Primary Examiner* — Thanh Nguyen
(74) *Attorney, Agent, or Firm* — Wade J. Brady, III; Frederick J. Telecky, Jr.

(57) ABSTRACT

An integrated circuit contains a voltage protection structure having a diode isolated DENMOS transistor with a guard element proximate to the diode and the DENMOS transistor. The guard element includes an active area coupled to ground. The diode anode is connected to an I/O pad. The diode cathode is connected to the DENMOS drain. The DENMOS source is grounded. A process of forming the integrated circuit is also disclosed.

19 Claims, 14 Drawing Sheets

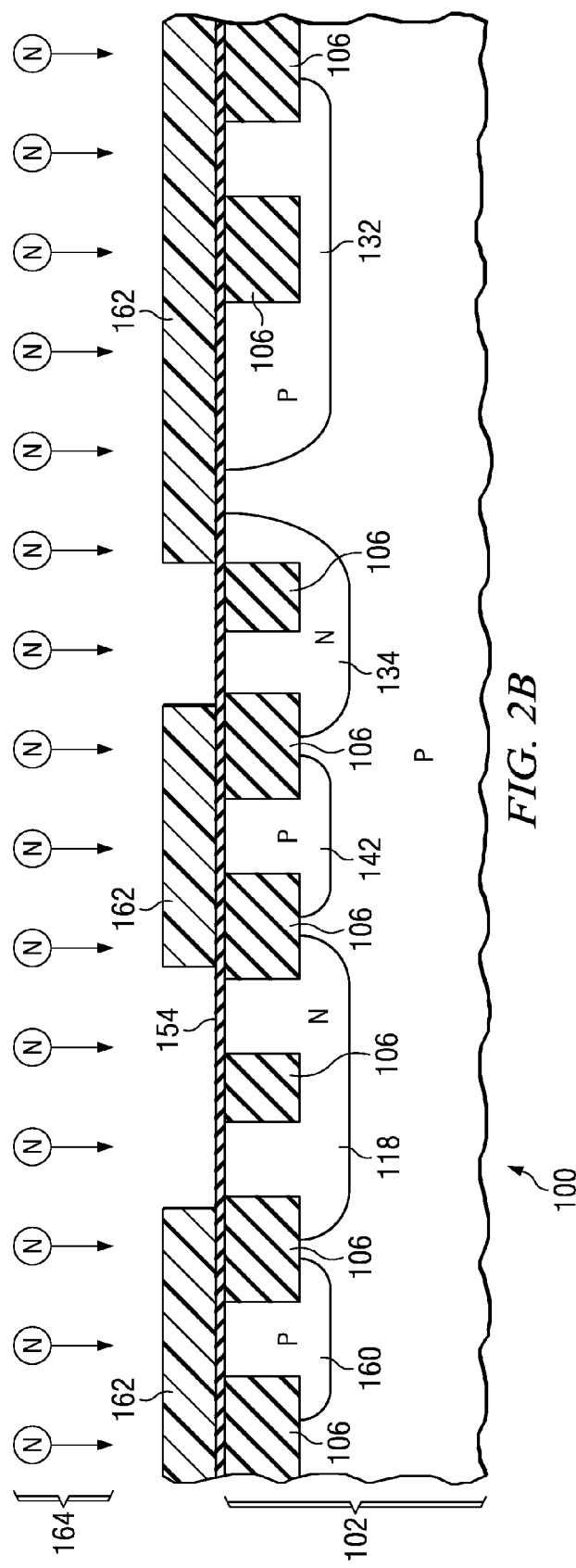
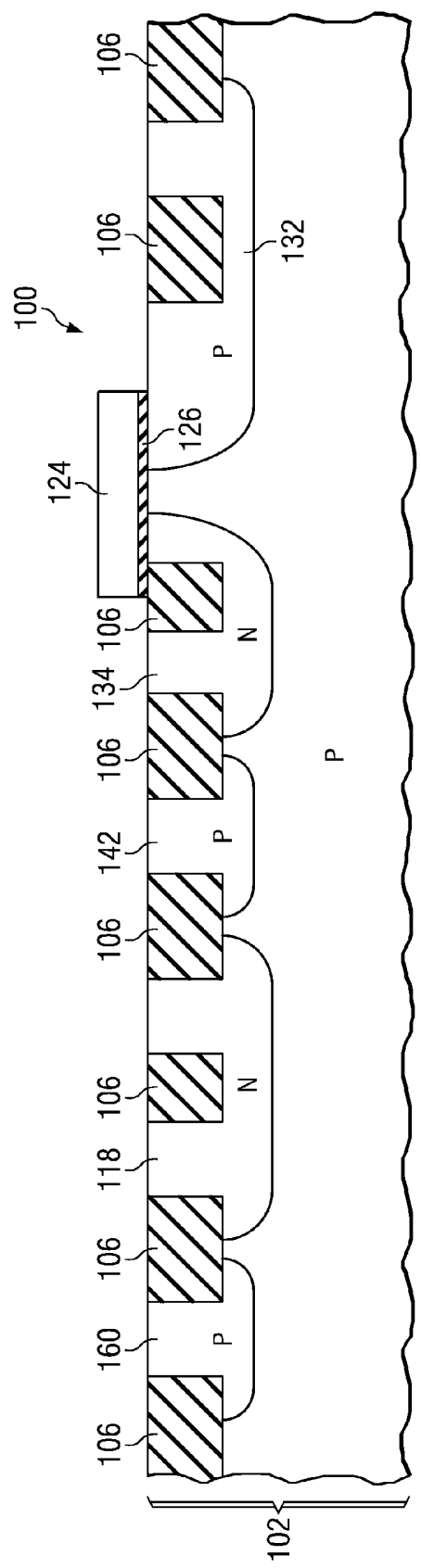
FIG. 2B
FIG. 2C

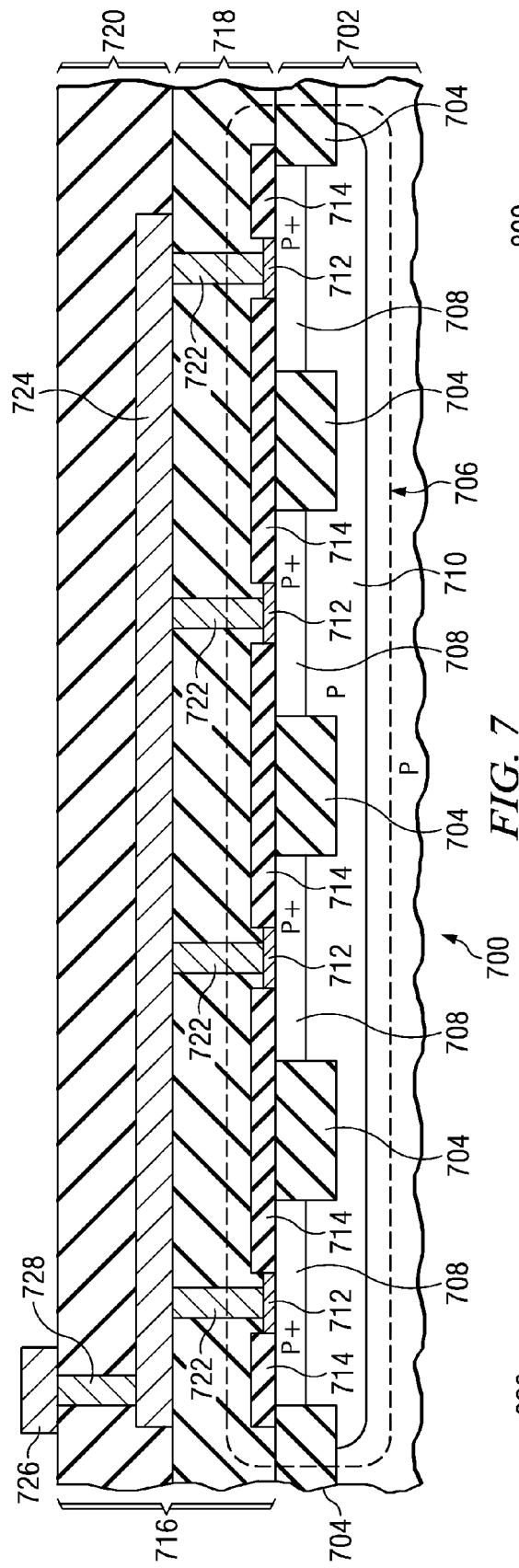
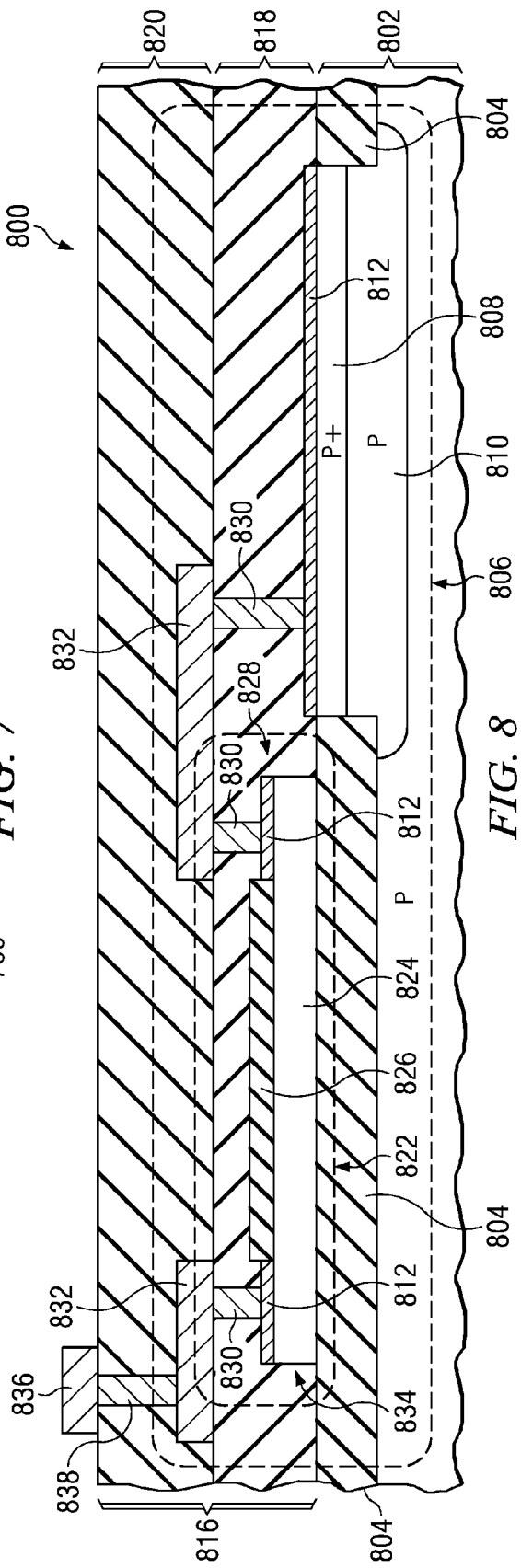
FIG. 7
FIG. 8

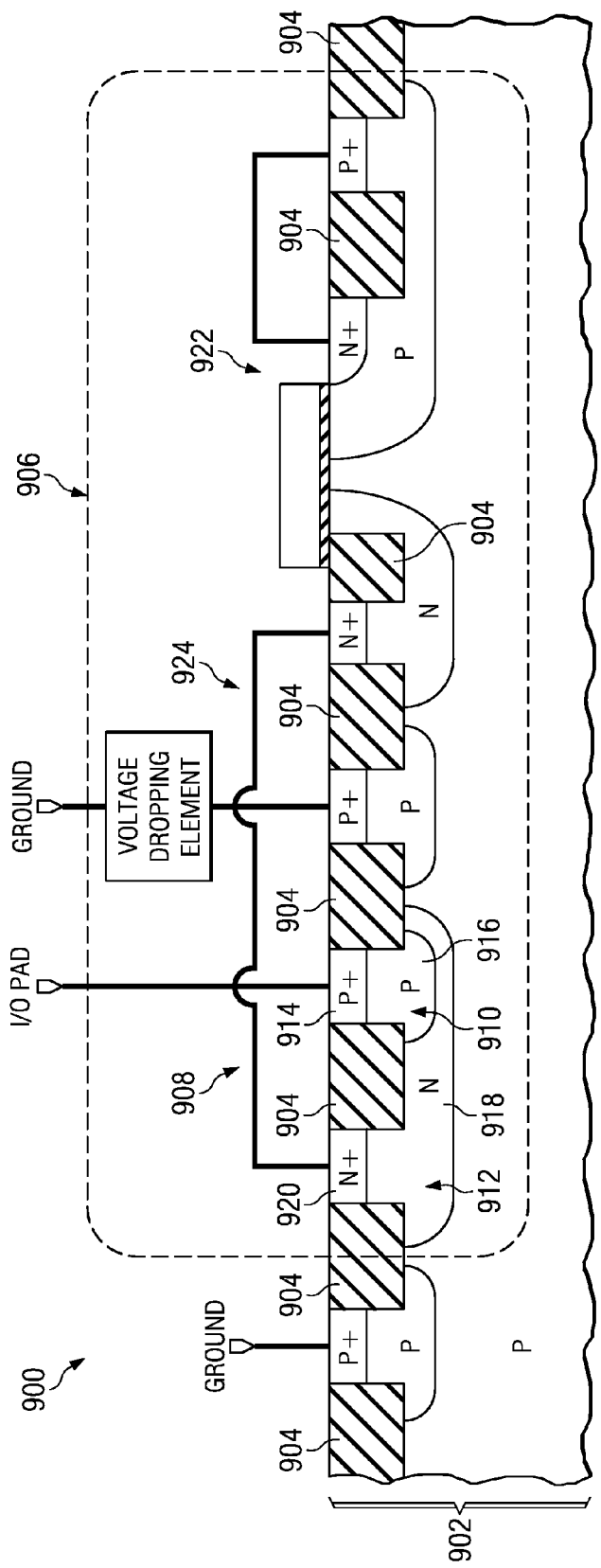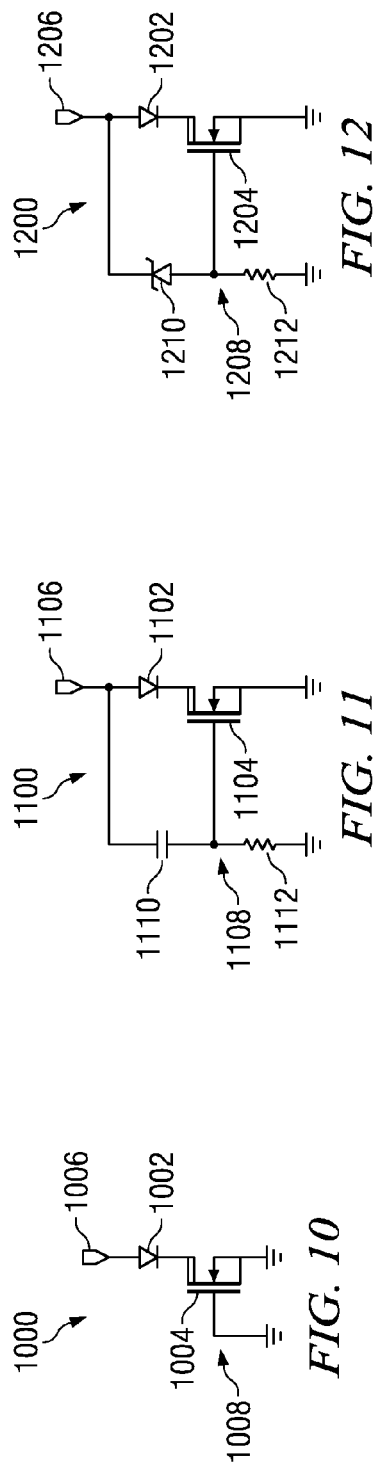

DIODE ISOLATED DRAIN EXTENDED NMOS ESD CELL

CROSS-REFERENCE TO RELATED APPLICATIONS

This application claims the benefit of priority under U.S.C. §119(e) of U.S. Provisional Application 61/427,709, filed Dec. 28, 2010.

FIELD OF THE INVENTION

This invention relates to the field of integrated circuits. More particularly, this invention relates to voltage protection structures in integrated circuits.

BACKGROUND OF THE INVENTION

An integrated circuit may contain a voltage protection structure connected to an input/output (I/O) pad of the integrated circuit, including a drain extended n-channel metal oxide semiconductor (DENMOS) transistor in a p-type substrate with a diode in series with the drain node of the DENMOS transistor. The anode of the diode is connected to the I/O pad. The source of the DENMOS is grounded. The diode combined with the transistor drain and the substrate may function as a silicon controlled rectifier (SCR) when an overvoltage occurs on the I/O pad, such as an electrostatic discharge (ESD) event, to raise the substrate potential of the DENMOS and so provide a low resistance path through the DENMOS from the I/O pad to ground. It may be desirable to increase the holding voltage of the protection structure while maintaining a desired trigger voltage. Increasing the lateral spacing between the diode and the DENMOS and/or increasing the area of the diode may increase the holding voltage, but will undesirably increase the area of the voltage protection structure.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit on a p-type substrate may include a voltage protection structure which includes a diode in series with a DENMOS transistor, and a guard element disposed proximate to the diode and the DENMOS transistor. The guard element is coupled to ground. The diode anode is connected to an I/O pad of the integrated circuit, and the DENMOS source is grounded. The guard element includes a heavily doped p-type region, possibly in a p-type well. A process of forming the integrated circuit is disclosed. An integrated circuit on an n-type substrate with a voltage protection structure including a diode in series with a drain extended p-channel metal oxide semiconductor (DEPMOS) transistor and a guard element disposed proximate to the diode and the DEPMOS transistor is also disclosed.

DESCRIPTION OF THE VIEWS OF THE DRAWING

FIG. 2A through FIG. 2E are cross sections of the integrated circuit 100 depicted in successive stages of fabrication.

FIG. 7 and FIG. 8 are cross sections of integrated circuits with guard elements and guard element resistors in voltage protection structures.

FIG. 9 is a cross section of an integrated circuit containing a voltage protection structure formed according to an alternate embodiment.

FIG. 10 through FIG. 12 are circuit schematics of diode-isolated DENMOS transistors in voltage protection structures, according to various embodiments.

DETAILED DESCRIPTION OF EXAMPLE EMBODIMENTS

An integrated circuit on a p-type substrate may include a voltage protection structure coupled to an I/O pad of the integrated circuit. The voltage protection structure includes a diode in series with a DENMOS transistor, and a guard element disposed proximate to the diode and the DENMOS transistor. The guard element is coupled to ground. The diode anode is connected to the I/O pad, and the DENMOS source is grounded. The guard element includes a heavily doped p-type region, possibly in a p-type well. It will be recognized that a corresponding voltage protection structure may be formed in an integrated circuit on an n-type substrate, with appropriate changes in polarity of the drain extended transistor, the diode and the guard element.

Figure 1:
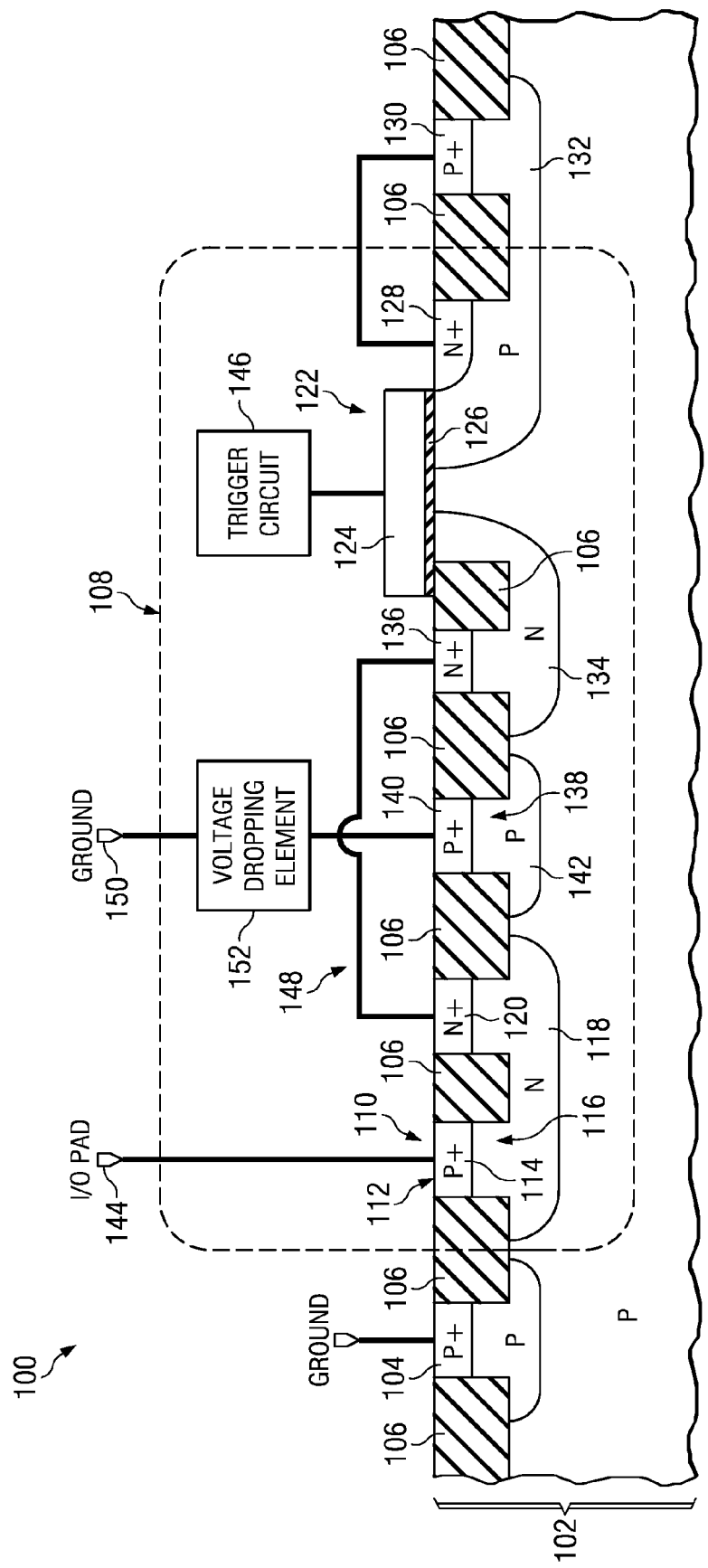
FIG. 1 is a cross section of an integrated circuit containing a voltage protection structure according to an embodiment.

FIG. 1 is a cross section of an integrated circuit containing a voltage protection structure according to an embodiment. The integrated circuit 100 is disposed in and on a p-type semiconductor substrate 102. The substrate 102 is connected to ground, for example through a ground contact active area 104. Field oxide elements 106 are disposed at a top surface of the substrate 102 to laterally isolate active areas of the integrated circuit 100. The voltage protection structure 108 includes a diode 110 having an anode 112, for example a p-type anode active area 114, and a cathode 116, for example an n-type cathode well 118 containing the p-type anode active area 114. The cathode 116 may include an n-type cathode contact active area 120.

The voltage protection structure 108 further includes a DENMOS transistor 122 proximate to the diode 110. The DENMOS transistor 122 includes a gate 124 disposed over a gate dielectric layer 126 on the substrate 102. An n-type source active area 128 of the DENMOS transistor 122 is disposed adjacent to the gate 124 and is connected to ground, for example to a grounded p-type substrate contact active area 130. The source active area 128 may be disposed in a p-type body well 132 which is in electrical contact with the substrate 102. An n-type drain drift region 134 of the DENMOS transistor 122 is disposed in the substrate 102. The drain drift region 134 extends under the gate 124 opposite from the source active area 128. An n-type drain contact active area 136 is disposed in the drain drift region 134 laterally separated from the gate 124, for example by an element of field oxide 106.

A p-type guard element 138 including a p-type guard element active area 140 in an optional p-type guard element well 142, is disposed in the substrate 102 proximate to the diode 110 and the DENMOS transistor 122, preferably between the cathode 116 and the DENMOS body well 132.

The diode anode 112 may be connected to an I/O pad 144 of the integrated circuit 100. The DENMOS gate 124, in one example, may be connected to a trigger circuit 146 as depicted in FIG. 1, or, in another example, may be grounded. The DENMOS drain contact active area 136 is electrically connected to the diode cathode 116, as indicated schematically in FIG. 1 by a drain-cathode link 148. The DENMOS drain contact active area 136 may be connected to the diode cathode 116, for example, through metal interconnection elements of the integrated circuit 100, possibly through the cathode contact active area 120, or through an n-type active area disposed in the substrate 102. The guard element 138 is coupled to a ground terminal 150 of the integrated circuit 100, optionally through a voltage dropping element 152. The voltage dropping element 152 may be, for example, a resistor, transistor, diode array, or a resistive portion of the guard element 138.

During operation of the integrated circuit 100, application of an overvoltage to the I/O pad 144 may cause holes to be injected from the diode anode 112 into the substrate 102. A portion of the injected holes may be collected by the guard element 138 and another portion may increase a substrate potential of the body well 132, thereby forward biasing a body-channel junction of the DENMOS transistor 122. The overvoltage at the I/O pad 144 may further cause the DENMOS gate 124 to be biased to an on-state, so that the DENMOS transistor 122 desirably provides a low resistance path between the I/O pad 144 and ground of the integrated circuit 100. The lateral dimensions and location of the guard element 138 and electrical characteristics of the voltage dropping element 152, if present, may be chosen to provide a desired division of the portion of injected hole collected by the guard element 138 and the portion which increases the substrate potential of the body well 132, thereby providing a desired holding voltage of the voltage protection structure 108.

Figure 2A:
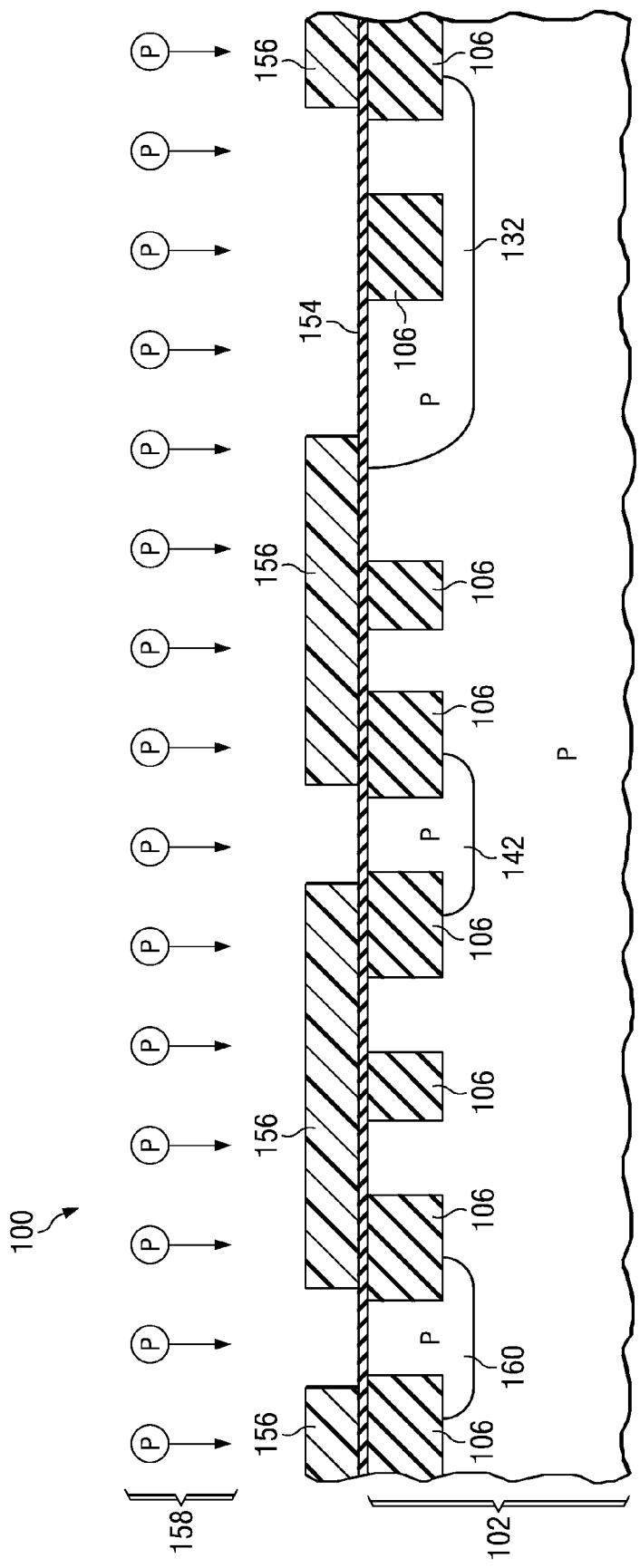

FIG. 2A through FIG. 2E are cross sections of the integrated circuit 100 depicted in successive stages of fabrication. Referring to FIG. 2A, The integrated circuit 100 is formed in and on the p-type semiconductor substrate 102, which may be a single crystal silicon wafer, a silicon-on-insulator (SOI) wafer, a hybrid orientation technology (HOT) wafer with regions of different crystal orientations, or other material appropriate for fabrication of the integrated circuit 100.

Elements of field oxide 106 are formed at the top surface of the substrate 102, typically of silicon dioxide between 250 and 600 nanometers thick, commonly by shallow trench isolation (STI) or local oxidation of silicon (LOCOS) processes. An STI process may include the steps of: forming an oxide layer on the substrate 102, forming a silicon nitride layer on the oxide layer, patterning the silicon nitride layer so as to expose an area for the field oxide 106, etching a trench in the substrate 102 in the exposed area to an appropriate depth for a desired thickness of the field oxide 106, growing a layer of thermal oxide on sidewalls and a bottom of the trench, filling the trench with silicon dioxide by chemical vapor deposition (CVD), high density plasma (HDP) or high aspect ratio process (HARP), removing unwanted silicon dioxide from a top surface of the silicon nitride layer, and removing the silicon nitride layer. A LOCOS process may include the steps of: forming an oxide layer on the substrate 102, forming a silicon nitride layer on the oxide layer, patterning the silicon nitride layer so as to expose an area for the field oxide 106, growing thermal oxide at the top surface of the substrate 102 in the exposed area to an appropriate thickness for a desired thickness of the field oxide 106, and removing the silicon nitride layer.

A sacrificial oxide layer 154, for example thermally grown silicon dioxide 3 to 10 nanometers thick, is formed at the top surface of the substrate 102. In one version of the instant embodiment, the sacrificial oxide layer 154 may be a remaining oxide layer from forming the field oxide 106. In another version, remaining oxide from forming the field oxide 106 may be removed using a wet etch of diluted hydrofluoric acid, and the sacrificial oxide layer 154 may be formed after the process of forming the field oxide 106 is completed. A p-well implant mask 156 is formed over the sacrificial oxide layer 154 so as to expose areas defined for p-type wells. The p-well implant mask 156 may include, for example, photoresist 1.5 to 2.5 microns thick. A p-well ion implant process is performed which implants p-type dopants 158 such as boron into the substrate 102 in areas exposed by the p-well implant mask 156. An exemplary p-well ion implant process may include implanting boron in three steps: a first dose of $5 \times 10^{12}$ cm$^{-2}$ to $1 \times 10^{13}$ cm$^{-2}$ at an energy of 50 keV to 100 keV, a second dose of $6 \times 10^{12}$ cm$^{-2}$ to $1.2 \times 10^{13}$ cm$^{-2}$ at an energy of 110 keV to 160 keV, and a third dose of $2 \times 10^{13}$ cm$^{-2}$ to $5 \times 10^{13}$ cm$^{-2}$ at an energy of 300 keV to 400 keV. The p-well implant mask 156 is removed after the p-well ion implant process is completed, for example by exposing the integrated circuit 100 to an oxygen containing plasma, followed by a wet clean step of an aqueous mixture of sulfuric acid and hydrogen peroxide and a subsequent wet clean step of an aqueous mixture of hydrogen peroxide and ammonium hydroxide to remove any organic residue from the top surface of the integrated circuit 100. A p-well anneal operation is subsequently performed which activates and diffuses the implanted p-type dopants to form the body well 132, the optional guard element well 142, and possibly a substrate contact well 160, as well as p-type wells of n-channel metal oxide semiconductor (NMOS) transistors, not shown, in the integrated circuit 100. The p-well anneal operation may include heating the substrate 102 at 1050 ° C. for 30 seconds or equivalent anneal conditions, for example, 1100° C. for 10 seconds, or 1000° C. for 100 seconds.

Referring to FIG. 2B, an n-well implant mask 162 is formed over the sacrificial oxide layer 154 so as to expose areas defined for n-type wells. The n-well implant mask 162 may include, for example, photoresist 1 to 2 microns thick. An n-well ion implant process is performed which implants n-type dopants 164 such as phosphorus and arsenic into the substrate 102 in areas exposed by the n-well implant mask 162. An exemplary n-well ion implant process may include implanting phosphorus in three steps: a first dose of $2 \times 10^{12}$ cm$^{-2}$ to $6 \times 10^{12}$ cm$^{-2}$ at an energy of 120 keV to 180 keV, a second dose of $2 \times 10^{12}$ cm$^2$ to $6 \times 10^{12}$ cm$^{-2}$ at an energy of 300 keV to 350 keV, and a third dose of $2 \times 10^{13}$ cm$^{-2}$ to $6 \times 10^{13}$ cm$^{-2}$ at an energy of 600 keV to 750 keV. The n-well implant mask 162 is removed after the n-well ion implant process is completed, for example using a similar process to that described in reference to FIG. 2A. An n-well anneal operation is subsequently performed which activates and diffuses the implanted n-type dopants to form the cathode well 118 and the drain drift region 134, as well as n-type wells of p-channel metal oxide semiconductor (PMOS) transistors, not shown, in the integrated circuit 100. The n-well anneal operation may include heating the substrate 102 at 1050° C. for 30 seconds or equivalent anneal conditions, for example, 1100° C. for 10 seconds, or 1000° C. for 100 seconds. The n-well anneal operation may be performed concurrently with the p-well anneal operation. In an alternate version of the instant embodiment, the drain drift region 134 may be formed by a separate ion implant process from the cathode well 118. In a further version, the n-well ion implant process may be performed before the p-well ion implant process.

Referring to FIG. 2C, the gate dielectric layer 126 is formed over the substrate 102 overlapping the body well 132 and the drain drift region 134. The gate dielectric layer 126 may be, for example, one or more layers of silicon dioxide, silicon oxy-nitride, aluminum oxide, aluminum oxy-nitride, hafnium oxide, hafnium silicate, hafnium silicon oxy-nitride, zirconium oxide, zirconium silicate, zirconium silicon oxy-nitride, a combination of the aforementioned materials, or other insulating material. The gate dielectric layer 126 may include nitrogen as a result of exposure to a nitrogen containing plasma or a nitrogen containing ambient gas at temperatures between 50° C. and 800° C. The gate dielectric layer 126 may be, for example, 2 to 12 nanometers thick. The gate dielectric layer 126 may be formed by any of a variety of gate dielectric formation processes, for example thermal oxidation, plasma nitridation of an oxide layer, and/or dielectric material deposition by atomic layer deposition (ALD).

The gate 124 is formed over the gate dielectric layer 126, for example by a process including the steps of: forming a layer of gate material such as polycrystalline silicon over an existing top surface of the integrated circuit 100 including the gate dielectric layer 126, forming a gate etch mask over the layer of gate material, and performing a gate etch process to remove unwanted gate material so as to leave the gate 124. The gate etch mask may include photoresist, an anti-reflection layer such as a bottom anti-reflection coat (BARC) under the photoresist, and possible hard mask materials such as silicon nitride or silicon carbide under the BARC. The gate etch process may include, for example, a reactive ion etch (RIE) process which provides fluorine radicals to the layer of gate material.

Figure 2D:
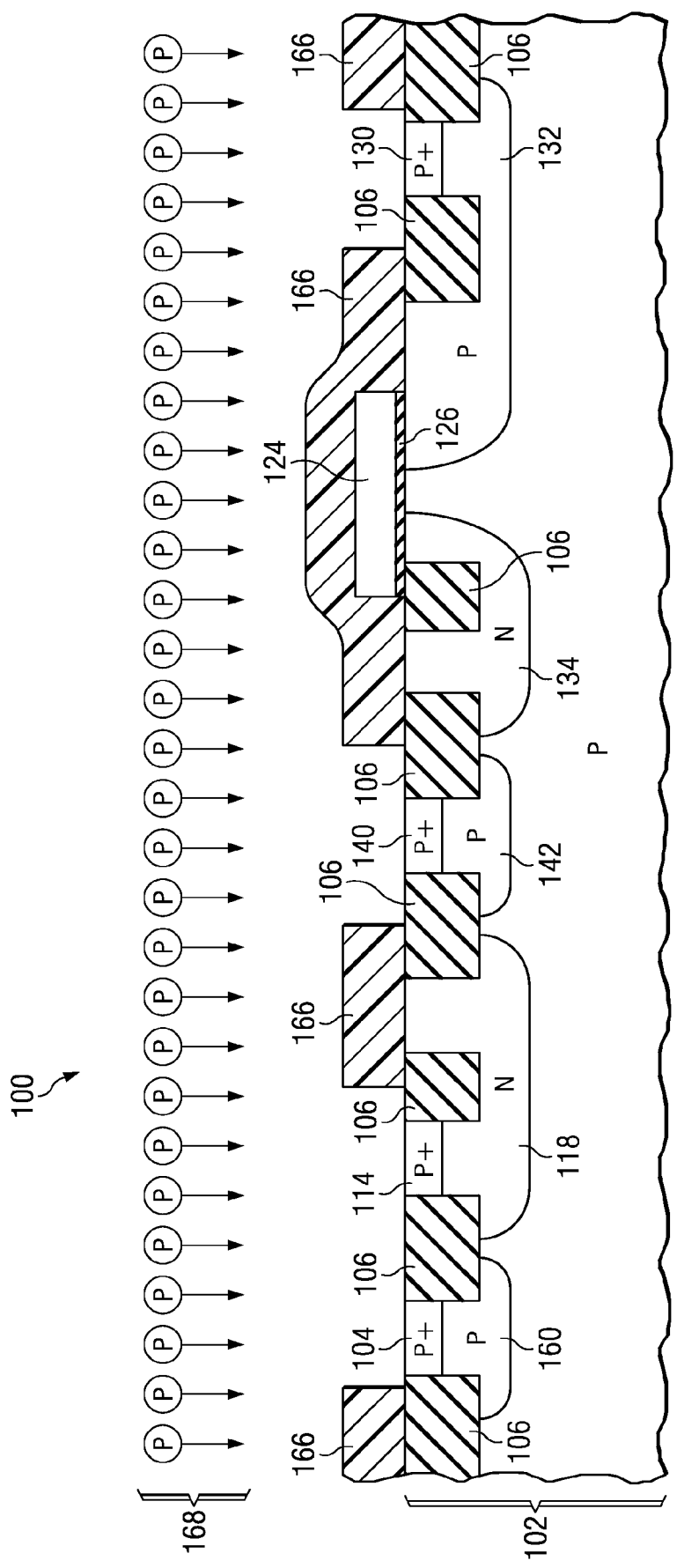

Referring to FIG. 2D, a p-channel source/drain (PSD) implant mask 166 is formed over an existing top surface of the integrated circuit 100 so as to expose areas defined for p-type active areas including source and drain regions of p-channel transistors. The PSD implant mask 166 may include, for example, photoresist 150 to 300 nanometers thick. A PSD ion implant process is performed which implants p-type dopants 168 such as boron into the substrate 102 in areas exposed by the PSD implant mask 166. An exemplary PSD ion implant process may include implanting boron at a dose of $1 \times 10^{15}$ $cm^{-2}$ to $4 \times 10^{15}$ $cm^{-2}$ at an energy of 60 keV to 15 keV. The PSD implant mask 166 is removed after the PSD ion implant process is completed, for example using a similar process to that described in reference to FIG. 2A. A PSD anneal operation is subsequently performed which activates and diffuses the implanted p-type dopants to form the ground contact active area 104, the anode active area 114, the substrate contact active area 130 and the guard element active area 140, as well as p-type source and drain regions of PMOS transistors, not shown, in the integrated circuit 100. The PSD anneal operation may include heating the substrate 102 at 1000° C. for 20 seconds or equivalent anneal conditions, for example, 1050° C. for 5 seconds, or 950° C. for 60 seconds.

Figure 2E:
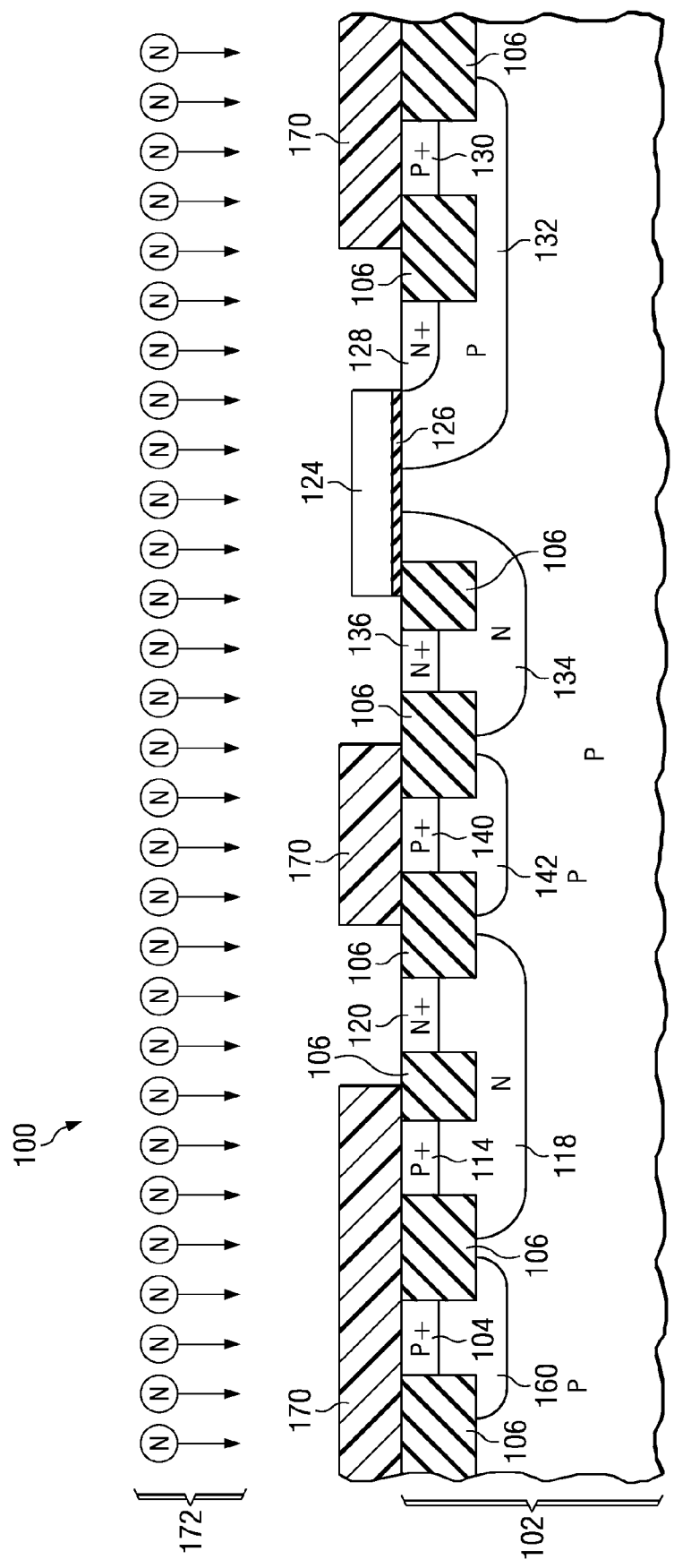

Referring to FIG. 2E, an n-channel source/drain (NSD) implant mask 170 is formed over an existing top surface of the integrated circuit 100 so as to expose areas defined for source and drain regions of n-channel transistors. The NSD implant mask 170 may include, for example, photoresist 150 to 300 nanometers thick. An NSD ion implant process is performed which implants n-type dopants 172 such as phosphorus and arsenic into the substrate 102 in areas exposed by the NSD implant mask 170. An exemplary NSD ion implant process may include implanting arsenic at a dose of $1 \times 10^{15}$ $cm^{-2}$ to $3 \times 10^{15}$ $cm^{-2}$ at an energy of 35 keV to 60 keV, followed by implanting phosphorus at a dose of $1 \times 10^{14}$ $cm^{-2}$ to $4 \times 10^{14}$ $cm^{-2}$ at an energy of 50 keV to 85 keV. The NSD implant mask 170 is removed after the NSD ion implant process is completed, for example using a similar process to that described in reference to FIG. 2A. An NSD anneal operation is subsequently performed which activates and diffuses the implanted n-type dopants to form the cathode contact active area 120, the source active area 128, and the drain contact active area 136, as well as n-type source and drain regions of NMOS transistors, not shown, in the integrated circuit 100. The NSD anneal operation may include heating the substrate 102 at 1000° C. for 20 seconds or equivalent anneal conditions, for example, 1050° C. for 5 seconds, or 950° C. for 60 seconds. The NSD anneal operation may be performed concurrently with the PSD anneal operation. In an alternate version of the instant embodiment, the NSD ion implant process may be performed before the PSD ion implant process.

Subsequent to the steps described in reference to FIG. 2A through FIG. 2E, metal interconnects of the integrated circuit 100 are formed over the substrate 102 so as to electrically connect the diode 110, the guard element 138 and the DENMOS transistor 122 as described in reference to FIG. 1. The metal interconnects may include contacts, metal lines and metal vias in a dielectric layer stack.

Figure 3:
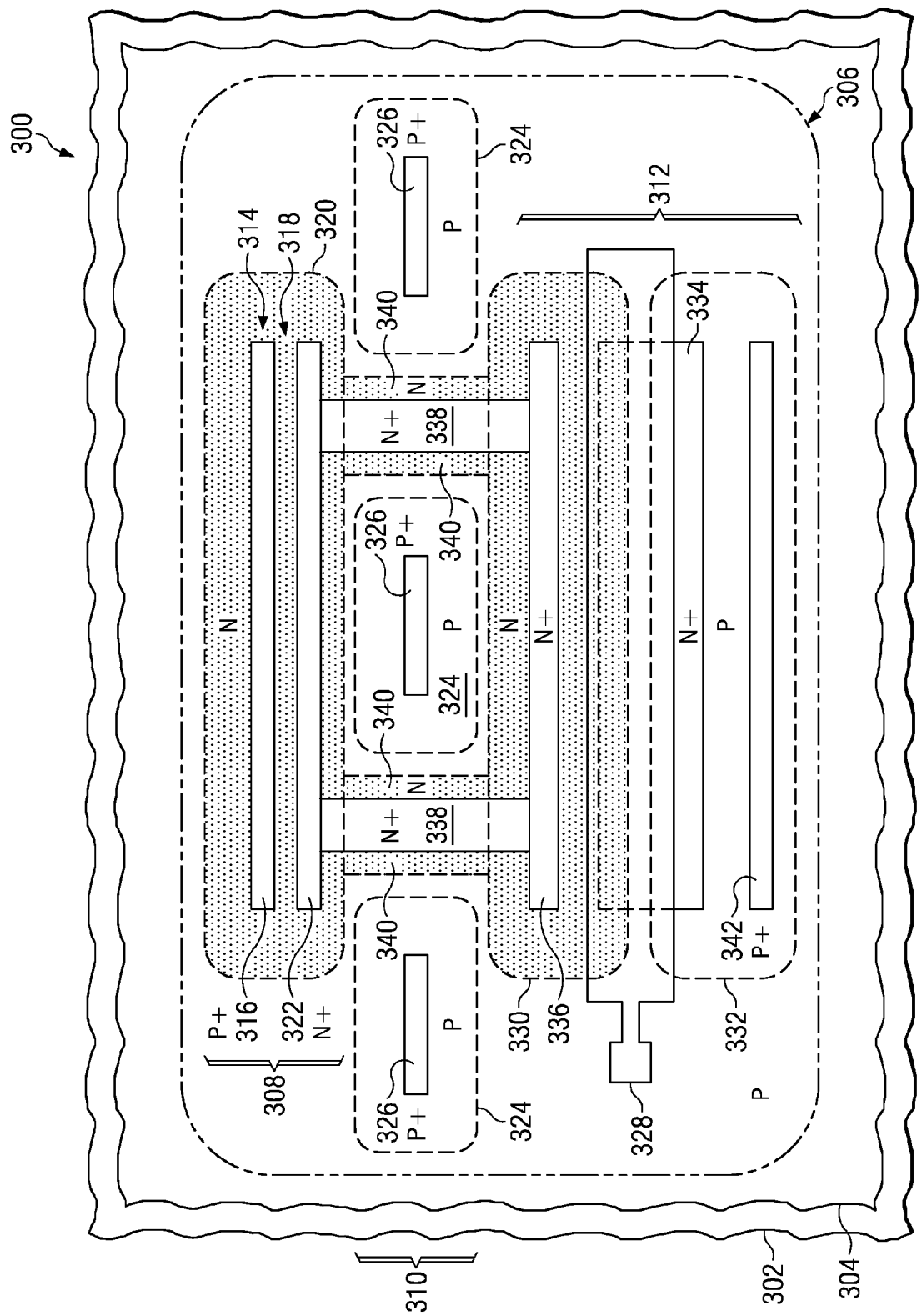
FIG. 3 is a top view of an integrated circuit containing a voltage protection structure formed according to an embodiment.

FIG. 3 is a top view of an integrated circuit containing a voltage protection structure formed according to an embodiment. The integrated circuit 300 is formed in and on a p-type substrate 302 as described in reference to FIG. 2A. Field oxide 304 is disposed at a top surface of the substrate 302 as described in reference to FIG. 1 and FIG. 2A. The voltage protection structure 306 includes a diode 308, a guard element 310 and a DENMOS transistor 312. The diode 308 has an anode 314 which includes a p-type anode active area 316, and a cathode 318 which includes an n-type cathode well 320 and an n-type cathode contact active area 322. The guard element 310 includes a segmented p-type guard element active area 326 disposed in a linear configuration in a segmented p-type guard element well 324.

The DENMOS transistor 312 includes a gate 328 which overlaps an n-type drain drift region 330 and a p-type body well 332 opposite from the drain drift region 330. An n-type source active area 334 is disposed in the body well 332 adjacent to the gate 328. An n-type drain contact active area 336 is disposed in the drain drift region 330 laterally separated from the gate 328 by the field oxide 304. A p-type substrate contact active area 342 is disposed in the body well 332.

In the instant embodiment, the DENMOS transistor 312 is oriented so that the drain contact active area 336 is adjacent to the guard element 310, which is disposed between the diode 308 and the DENMOS transistor 312. Furthermore, in the instant embodiment, the cathode contact active area 322 is electrically connected to the drain contact active area 336 by at least one n-type active area link 338 disposed in at least one n-type link well 340. Connecting the cathode contact active area 322 to the drain contact active area 336 through active area may advantageously reduce an area of the voltage protection structure 306. The cathode well 320, the drain drift region 330 and the link wells 340 are depicted in FIG. 3 with a stipple pattern to highlight their configuration.

Figure 4:
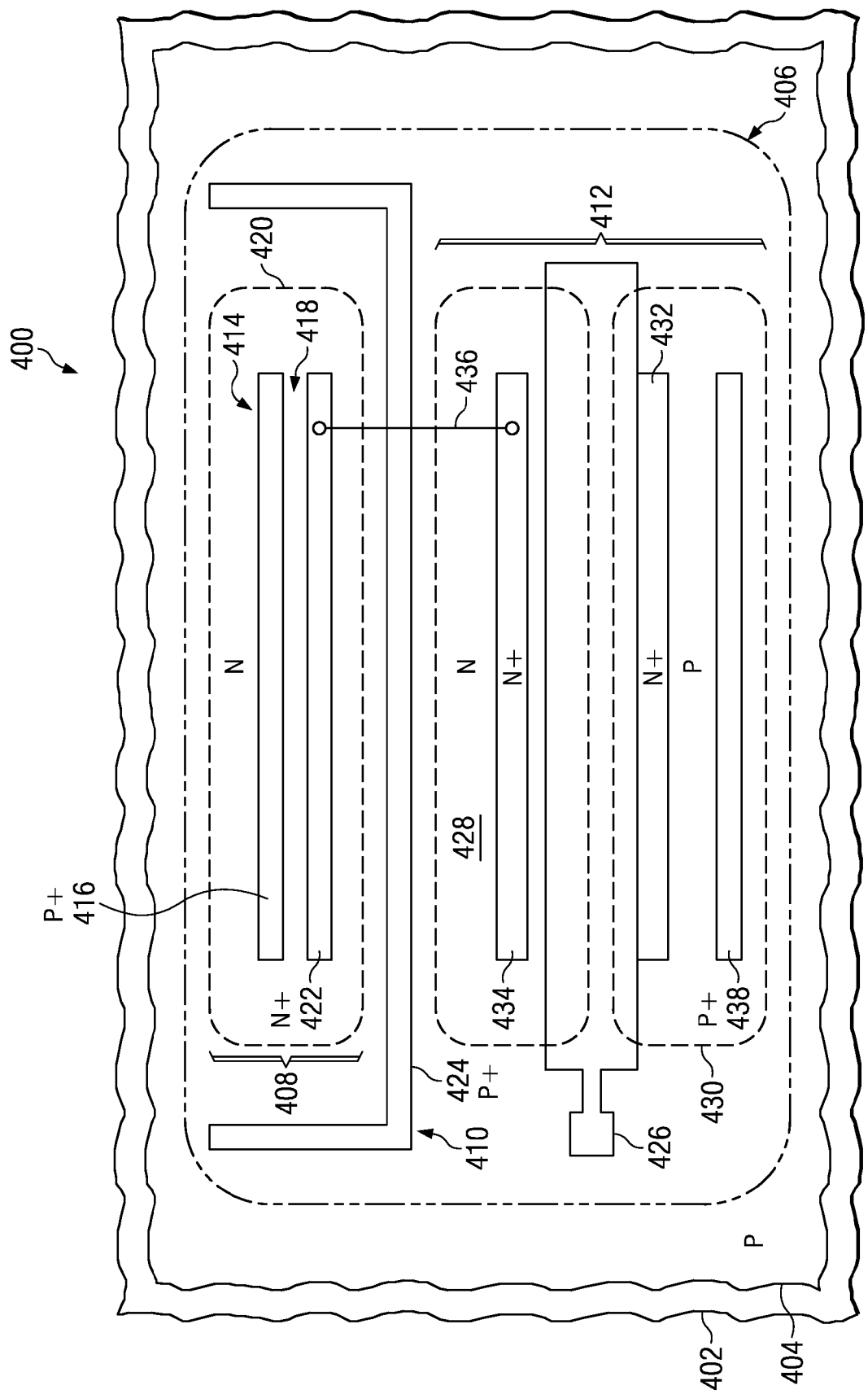
FIG. 4 is a top view of an integrated circuit containing a voltage protection structure formed according to another embodiment.

FIG. 4 is a top view of an integrated circuit containing a voltage protection structure formed according to another embodiment. The integrated circuit 400 is formed in and on a p-type substrate 402 as described in reference to FIG. 2A. Field oxide 404 is disposed at a top surface of the substrate 402 as described in reference to FIG. 1 and FIG. 2A. The voltage protection structure 406 includes a diode 408, a guard element 410 and a DENMOS transistor 412. The diode 408 has an anode 414 which includes a p-type anode active area 416, and a cathode 418 which includes an n-type cathode well 420 and an n-type cathode contact active area 422. The guard element 410 includes a continuous p-type guard element active area 424 disposed in the substrate 402 partially surrounding the diode 408.

The DENMOS transistor 412 includes a gate 426 which overlaps an n-type drain drift region 428 and a p-type body well 430 opposite from the drain drift region 428. An n-type source active area 432 is disposed in the body well 430 adjacent to the gate 426. An n-type drain contact active area 434 is disposed in the drain drift region 428 laterally separated from the gate 426 by the field oxide 404. A p-type substrate contact active area 438 is disposed in the body well 430. In the instant embodiment, the DENMOS transistor 412 is oriented so that the drain contact active area 434 is adjacent to the guard element 410, which is disposed between the diode 408 and the DENMOS transistor 412. The cathode contact active area 422 is electrically connected to the drain contact active area 434 by metal interconnect elements of the integrated circuit 400, depicted schematically in FIG. 4 by link 436. Forming the guard element 410 so as to partially surround the diode 408 may provide a desired higher holding voltage of the voltage protection structure 406.

Figure 5:
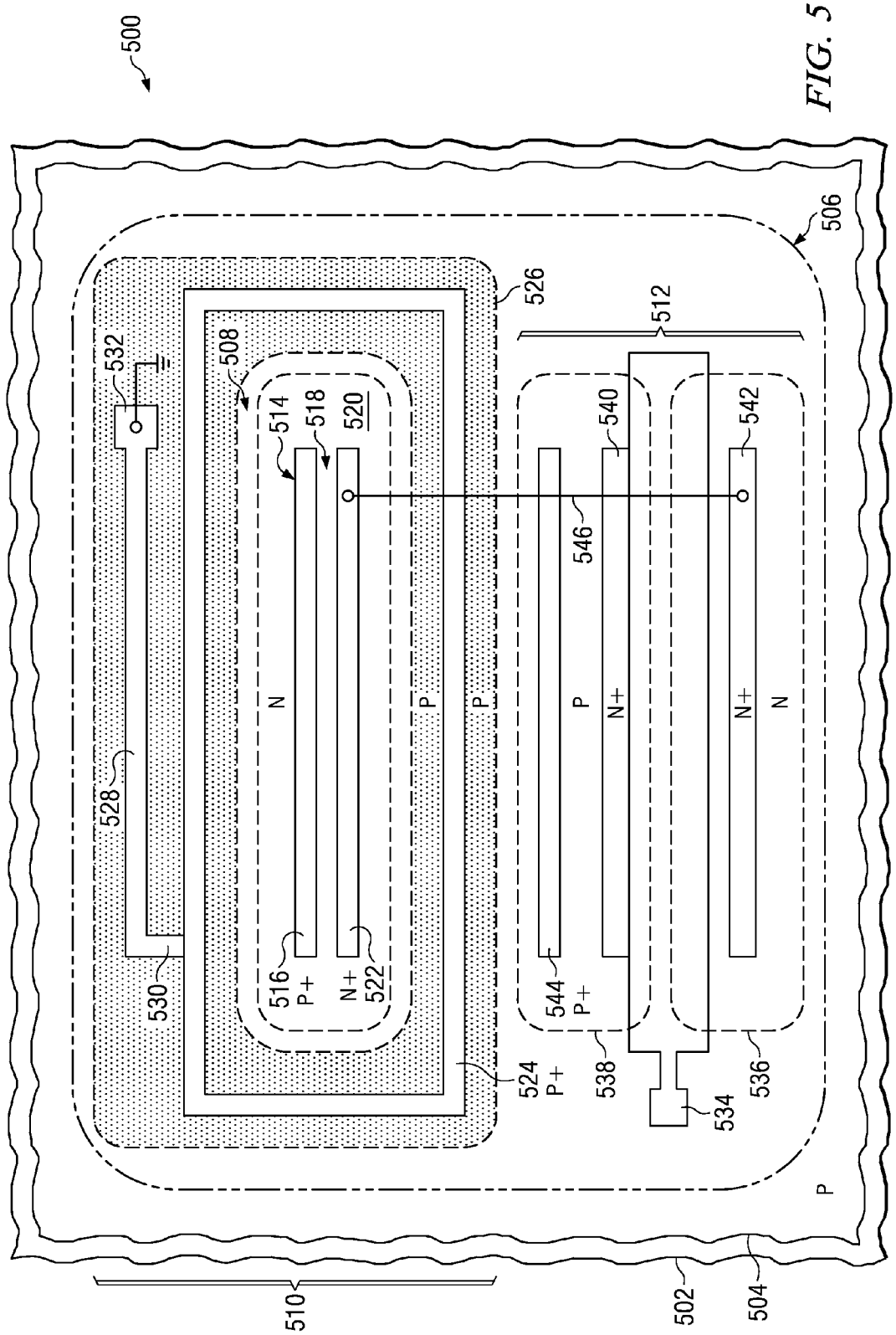
FIG. 5 is a top view of an integrated circuit containing a voltage protection structure formed according to a further embodiment.

FIG. 5 is a top view of an integrated circuit containing a voltage protection structure formed according to a further embodiment. The integrated circuit 500 is formed in and on a p-type substrate 502 as described in reference to FIG. 2A. Field oxide 504 is disposed at a top surface of the substrate 502 as described in reference to FIG. 1 and FIG. 2A. The voltage protection structure 506 includes a diode 508, a guard element 510 and a DENMOS transistor 512. The diode 508 has an anode 514 which includes a p-type anode active area 516, and a cathode 518 which includes an n-type cathode well 520 and an n-type cathode contact active area 522.

The guard element 510 includes a continuous p-type guard element active area 524 disposed in a p-type guard element well 526 in the substrate 502 surrounding the diode 508. The guard element well 526 is depicted in FIG. 5 with a diagonal hatch pattern to highlight its surrounding configuration. A p-type active area guard element resistor 528 is disposed in the guard element well 526, contacting the guard element active area 524 at a guard element terminus 530 of the guard element resistor 528. A ground terminus 532 of the guard element resistor 528 is connected to an instance of a ground node of the integrated circuit 500 as depicted schematically in FIG. 5. In one version of the instant embodiment, the guard element resistor 528 may include a layer of metal silicide on the substrate 102. In another version, at least a portion of the guard element resistor 528 may be free of metal silicide.

The DENMOS transistor 512 includes a gate 534 which overlaps an n-type drain drift region 536 and a p-type body well 538 opposite from the drain drift region 536. An n-type source active area 540 is disposed in the body well 538 adjacent to the gate 534. An n-type drain contact active area 542 is disposed in the drain drift region 536 laterally separated from the gate 534 by the field oxide 504. A p-type substrate contact active area 544 is disposed in the body well 538. In the instant embodiment, the DENMOS transistor 512 is oriented so that the source active area 540 is adjacent to the guard element 510, a portion which is disposed between the diode 508 and the DENMOS transistor 512. The cathode contact active area 522 is electrically connected to the drain contact active area 542 by metal interconnect elements of the integrated circuit 500, depicted schematically in FIG. 5 by link 546. Forming the guard element 510 so as to surround the diode 508 may provide a desired higher holding voltage of the voltage protection structure 506. Forming the guard element resistor 528 in an active area proximate to the guard element active area 524 may advantageously reduce an area of the voltage protection structure 506.

Figure 6:
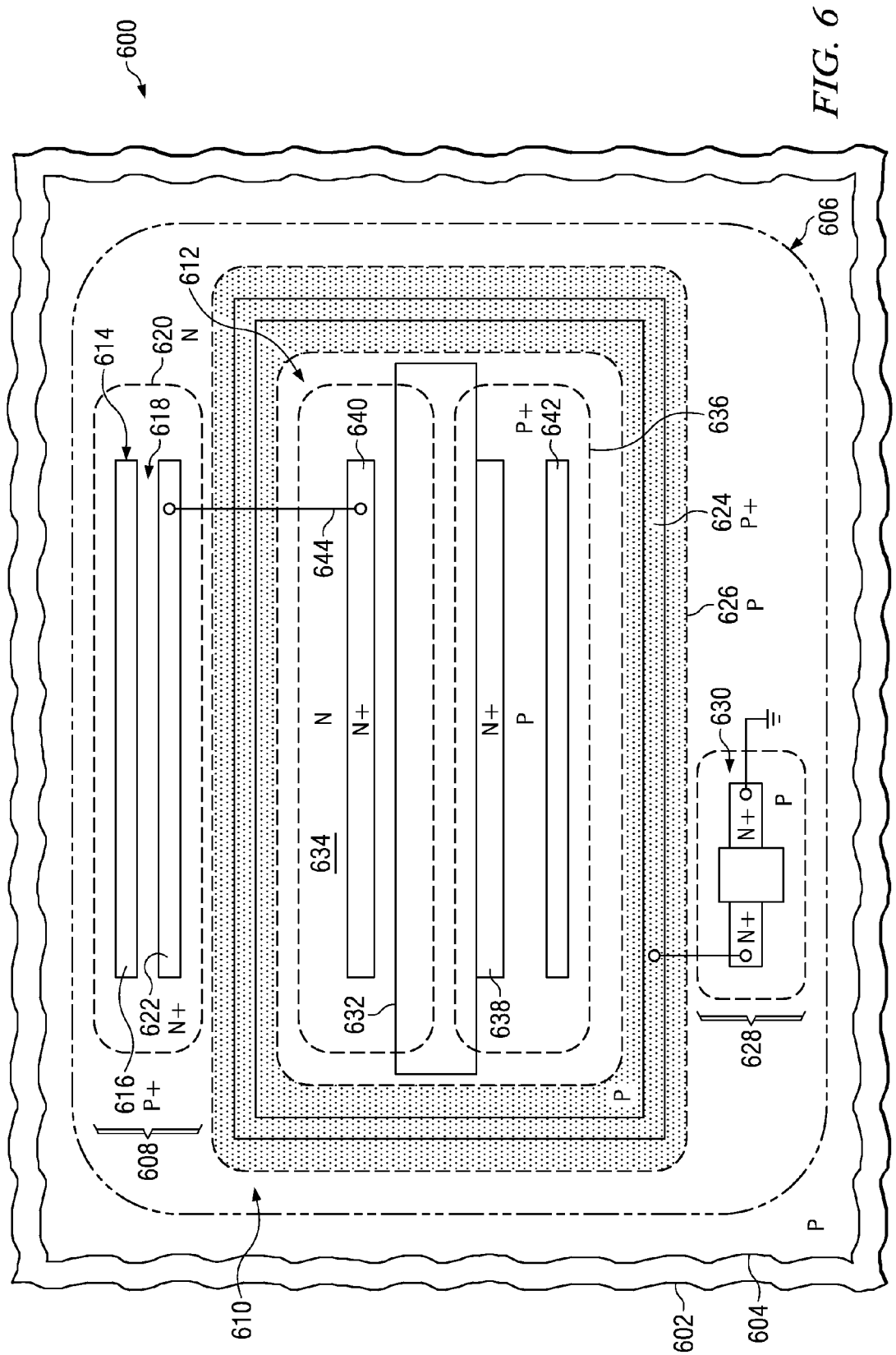
FIG. 6 is a top view of an integrated circuit containing a voltage protection structure formed according to another embodiment.

FIG. 6 is a top view of an integrated circuit containing a voltage protection structure formed according to another embodiment. The integrated circuit 600 is formed in and on a p-type substrate 602 as described in reference to FIG. 2A. Field oxide 604 is disposed at a top surface of the substrate 602 as described in reference to FIG. 1 and FIG. 2A. The voltage protection structure 606 includes a diode 608, a guard element 610 and a DENMOS transistor 612. The diode 608 has an anode 614 which includes a p-type anode active area 616, and a cathode 618 which includes an n-type cathode well 620 and an n-type cathode contact active area 622.

The guard element 610 includes a continuous p-type guard element active area 624 disposed in a p-type guard element well 626 in the substrate 602 surrounding the DENMOS transistor 612. The guard element well 626 is depicted in FIG. 6 with a diagonal hatch pattern to highlight its surrounding configuration. A guard element resistor 628 which includes an NMOS transistor 630 is disposed adjacent to the guard element well 626. A drain node of the NMOS transistor 630 is coupled to the guard element active area 624. A source node of the NMOS transistor 630 is electrically connected to an instance of a ground node of the integrated circuit 600.

The DENMOS transistor 612 includes a gate 632 which overlaps an n-type drain drift region 634 and a p-type body well 636 opposite from the drain drift region 634. An n-type source active area 638 is disposed in the body well 636 adjacent to the gate 632. An n-type drain contact active area 640 is disposed in the drain drift region 634 laterally separated from the gate 632 by the field oxide 604. A p-type substrate contact active area 642 is disposed in the body well 636. In the instant embodiment, the DENMOS transistor 612 is oriented so that the drain contact active area 640 is adjacent to the diode 608. The guard element 610 surrounds the DENMOS transistor 612. The cathode contact active area 622 is electrically connected to the drain contact active area 640 by metal interconnect elements of the integrated circuit 600, depicted schematically in FIG. 6 by link 644. Forming the guard element 610 so as to surround the DENMOS transistor 612 may provide a desired higher holding voltage of the voltage protection structure 506. Forming the guard element resistor 628 with a transistor 630 may advantageously reduce an area of the voltage protection structure 606.

FIG. 7 and FIG. 8 are cross sections of integrated circuits with guard elements and guard element resistors in voltage protection structures. Referring to FIG. 7, the integrated circuit 700 is formed in and on a p-type substrate 702 as described in reference to FIG. 2A. Field oxide 704 is disposed at a top surface of the substrate 702 as described in reference to FIG. 1 and FIG. 2A. A voltage protection structure includes a guard element 706 which has a segmented p-type guard element active area 708 disposed in a p-type guard element well 710 in the substrate 702. Metal silicide 712 is formed on a portion of each segment of the guard element active area 708. A portion of each segment of the guard element active area 708 is free of metal silicide, for example by use of a silicide block layer 714 formed prior to formation of the metal silicide 712. The silicide block layer 714 may be, for example, 30 to 80 nanometers of silicon dioxide or silicon nitride.

A dielectric layer stack 716 is formed over the substrate 702. The dielectric stack 716 may include, for example a pre-metal dielectric (PMD) layer 718 disposed on the substrate 702 and the metal silicide 712, and an inter-level dielectric (ILD) layer 720 disposed over the PMD layer 718. The PMD layer 718 may be, for example, a stack of dielectric layers including a PMD liner, a PMD main layer, and an optional PMD cap layer. The PMD liner may be silicon nitride or silicon dioxide, 10 to 100 nanometers thick, deposited by a plasma enhanced chemical vapor deposition (PECVD) process. The PMD main layer may be a layer of silicon dioxide formed by a HARP process followed by a layer of silicon dioxide, phospho-silicate glass (PSG) or boro-phospho-silicate glass (BPSG), for example 100 to 1000 nanometers thick, deposited by a PECVD process on a top surface of the PMD liner, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer. Metal contacts 722 are formed in the PMD layer 718, so as to make electrical contact to the metal silicide 712 on each guard element active area 708. The contacts 722 may be formed, for example, by defining contact areas on a top surface of the PMD layer 718 with a contact photoresist pattern, etching contact holes in the contact areas by removing PMD layer material using a reactive ion etching process to expose the metal silicide 712, and filling the contact holes with a contact liner metal, such as a first layer of titanium and a second layer of titanium nitride, and a contact fill metal, typically tungsten, followed by removal of the contact fill metal from the top surface of the PMD layer 718 using etchback and/or CMP methods.

The ILD layer 720 is disposed over the contacts 722. The ILD layer 720 may be, for example, a stack of dielectric layers including silicon dioxide, a low-k dielectric material such as organo-silicate glass (OSG), carbon-doped silicon oxides (SiCO or CDO) or methylsilsesquioxane (MSQ), and/or an ultra low-k dielectric material such as porous OSG (p-OSG). The ILD layer 720 may be formed, for example, using chemical vapor deposition (CVD), PECVD, low pressure chemical vapor deposition (LPCVD), atmospheric pressure chemical vapor deposition (APCVD), high density plasma (HDP), an ozone based thermal CVD process, also known as the high aspect ratio process (HARP), or other suitable dielectric layer formation process.

A metal interconnect 724 is formed in the ILD layer 720 so as to make electrical contact to the contacts 722. In one version of the instant embodiment, the metal interconnect 724 may be a stack of a titanium containing adhesion layer, an aluminum allow main layer and a titanium nitride cap layer, formed by depositing a metal layer stack on the PMD layer 718, forming an etch mask on the metal layer stack and etching the metal layer stack using a chlorine-containing RIE process, followed by deposition of the ILD layer 720. In another version, the metal interconnect 724 may be a copper interconnect with a tantalum nitride line, formed in the ILD layer 720 using a damascene process. The metal interconnect 724 is electrically coupled to an instance of a ground node 726 of the integrated circuit 700, for example through a metal via 728. The metal via 728 may be a tungsten via with a titanium and titanium nitride liner made using a similar process as used for the contacts 722 or may be a copper via with a tantalum nitride liner made using a damascene process.

The guard element active area 708 segments have an electrical resistivity under the silicide block layer 714. Forming the guard element active area 708 segments with the silicide block layer 714 may provide a desired resistance of the guard element active area 708 segments so as to provide a desired fraction of holes injected to the substrate 702 from a diode of the voltage protection circuit to be collected by the guard element 706.

Referring to FIG. 8, the integrated circuit 800 is formed in and on a p-type substrate 802 as described in reference to FIG. 2A. Field oxide 804 is disposed at a top surface of the substrate 802 as described in reference to FIG. 1 and FIG. 2A. A voltage protection structure includes a guard element 806 which has a p-type guard element active area 808 disposed in a p-type guard element well 810 in the substrate 802. Metal silicide 812 may be formed on the guard element active area 808.

A dielectric layer stack 816 including a PMD layer 818 and an ILD layer 820 is formed over the substrate 802, as described in reference to FIG. 7. A guard element resistor 822, which includes a resistor element 824 of gate material, such as polysilicon, metal silicide 812 on heads of the resistor 822, and a silicide block layer 826 over a body of the resistor 822, is formed in the PMD layer 818. The guard element resistor 822 may be formed concurrently with a gate of a DENMOS transistor in the voltage protection structure containing the guard element 806. A guard element terminus 828 of the guard element resistor 822 is electrically connected to the guard element active area 808, for example through contacts 830 and a metal interconnect line 832 similar to those described in reference to FIG. 7. A ground terminus 834 of the guard element resistor 822 is connected to an instance of a ground node 836 of the integrated circuit 800, for example through a contact 830, a metal interconnect line 832 and a metal via 838 similar to those described in reference to FIG. 7. Forming the guard element 806 with the guard element resistor 822 of gate material may advantageously provide a desired fraction of holes injected to the substrate 802 from a diode of the voltage protection circuit to be collected by the guard element 806 while desirably reducing an area of the guard element 806 compared to other configurations of guard elements with other types of resistors.

FIG. 9 is a cross section of an integrated circuit containing a voltage protection structure formed according to an alternate embodiment. The integrated circuit 900 is formed in and on a p-type semiconductor substrate 902 as described in reference to FIG. 2A. Field oxide 904 is disposed at a top surface of the substrate 902 as described in reference to FIG. 1 and FIG. 2A. The voltage protection structure 906 includes a diode 908 having an anode 910 and a cathode 912. In the instant embodiment, the anode 910 includes a p-type anode active area 914 in a p-type anode compensated well 916. The cathode 912 includes an n-type cathode well 918 containing the anode 910. An n-type cathode contact active area 920 is disposed in the cathode well 918. The voltage protection structure 906 further includes a DENMOS transistor 922 and a guard element 924 as described in reference to FIG. 1. Forming the anode 910 to include the p-type compensated well 916 may desirably provide a higher hole injection efficiency into the substrate 902 compared to diodes with other configurations of anodes.

FIG. 10 through FIG. 12 are circuit schematics of diode-isolated DENMOS transistors in voltage protection structures, according to various embodiments. Referring to FIG. 10, a diode-isolated DENMOS transistor 1000 includes a diode 1002 in series with a DENMOS transistor 1004 as described in reference to any of FIG. 1 through FIG. 9. An anode of the diode 1002 is connected to an I/O pad 1006. A source node of the DENMOS transistor 1004 is grounded. In the instant embodiment, a gate node 1008 of the DENMOS transistor 1004 is grounded. Grounding the gate node 1008 may provide an acceptable trigger level of a voltage protection structure containing the diode-isolated DENMOS transistor 1000 while advantageously reducing an area of the diode-isolated DENMOS transistor 1000 compared to diode-isolated DENMOS transistors with other configurations.

Referring to FIG. 11, a diode-isolated DENMOS transistor 1100 includes a diode 1102 in series with a DENMOS transistor 1104; an anode of the diode 1102 is connected to an I/O pad 1106. In the instant embodiment, a gate node 1108 of the DENMOS transistor 1104 is coupled through a capacitor 1110 to the I/O pad 1106 and through a resistor 1112 to ground, which may advantageously reduce a trigger level of a voltage protection structure containing the diode-isolated DENMOS transistor 1100 while advantageously reducing a fabrication cost and complexity of the diode-isolated DENMOS transistor 1100 compared to diode-isolated DENMOS transistors with other configurations.

Referring to FIG. 12, a diode-isolated DENMOS transistor 1200 includes a diode 1202 in series with a DENMOS transistor 1204; an anode of the diode 1202 is connected to an I/O pad 1206. In the instant embodiment, a gate node 1208 of the DENMOS transistor 1204 is coupled through a zener diode 1210 to the I/O pad 1206 and through a resistor 1212 to ground, which may advantageously provide a desired trigger level of a voltage protection structure containing the diode-isolated DENMOS transistor 1200.

Figure 13:
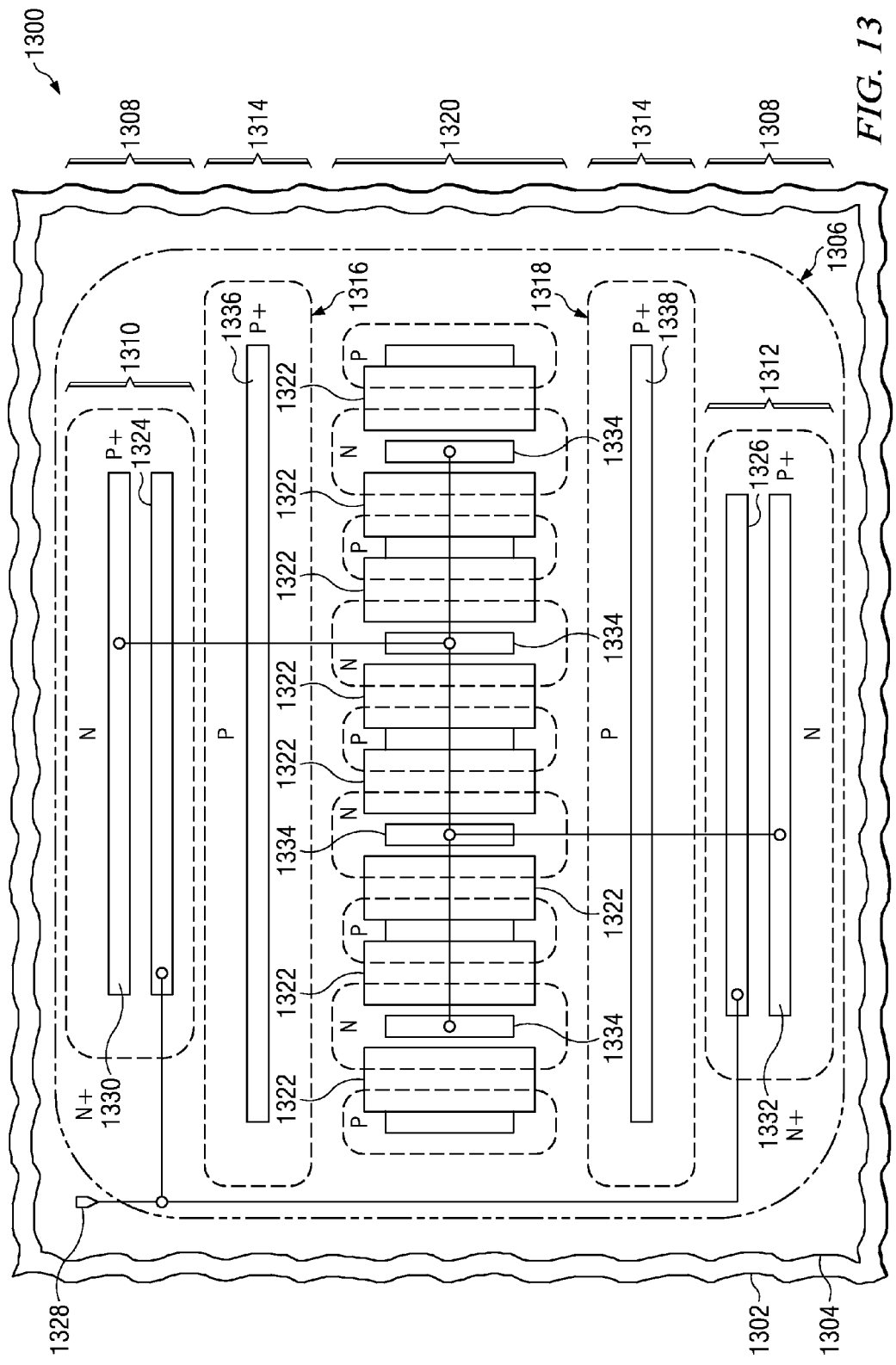
FIG. 13 and FIG. 14 are top views of integrated circuits containing voltage protection structures according to other embodiments.
Figure 14:
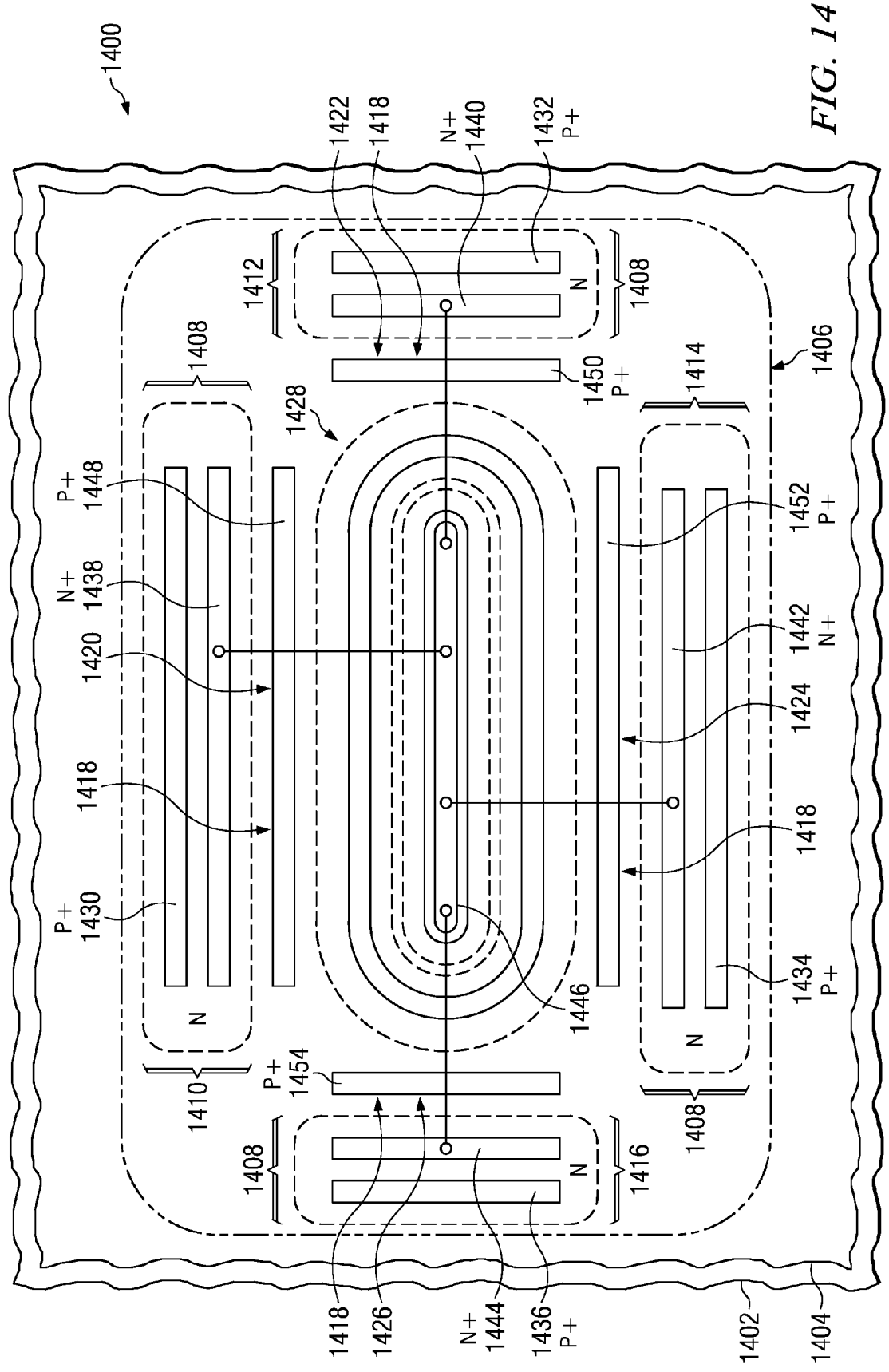

FIG. 13 and FIG. 14 are top views of integrated circuits containing voltage protection structures according to embodiments. Referring to FIG. 13, an integrated circuit 1300 is formed in and on a p-type semiconductor substrate 1302 as described in reference to FIG. 2A. Field oxide 1304 is disposed at a top surface of the substrate 1302 as described in reference to FIG. 1 and FIG. 2A. The voltage protection structure 1306 includes a diode 1308 which includes a first diode portion 1310 and a second diode portion 1312, a guard element 1314 which includes a first guard element portion 1316 and a second guard element portion 1318, and a DENMOS transistor 1320.

In the instant embodiment, the DENMOS transistor 1320 includes a plurality of linear gate portions 1322 disposed in a linear array. The first guard element portion 1316 is disposed adjacent to the DENMOS transistor 1320 and the second guard element portion 1318 is disposed adjacent to the DENMOS transistor 1320 opposite from the first guard element portion 1316. The first diode portion 1310 is disposed adjacent to the first guard element portion 1316 opposite from the DENMOS transistor 1320, and the second diode portion 1312 is disposed adjacent to the second guard element portion 1318 opposite from the DENMOS transistor 1320.

A first anode active area portion 1324 of the first diode portion 1310 and a second anode active area portion 1326 of the second diode portion 1312 are electrically connected to an I/O pad 1328 of the integrated circuit 1300. A first cathode active area portion 1330 of the first diode portion 1310 and a second cathode active area portion 1332 of the second diode portion 1312 are electrically connected to drain contact active areas 1334 of the DENMOS transistor 1320.

A first guard element active area 1336 of the first guard element portion 1316 and a second guard element active area 1338 of the second guard element portion 1318 are coupled to at least one instance of a ground node of the integrated circuit 1300. In one version of the instant embodiment, the first guard element active area 1336 may be coupled to the ground node independently of the second guard element active area 1338. In another version, the first guard element active area 1336 and the second guard element active area 1338 may be coupled to the ground node through a common voltage dropping element such as a resistor.

Configuring the voltage protection structure 1306 to have the first diode portion 1310 and the second diode portion 1312 on opposite sides of the DENMOS transistor 1320, and to have the first guard element portion 1316 disposed between the first diode portion 1310 and the DENMOS transistor 1320 and the second guard element portion 1318 disposed between the second diode portion 1312 and DENMOS transistor 1320 may provide a uniform substrate potential under the DENMOS transistor 1320 and thereby advantageously provide a more uniform current density in the DENMOS transistor 1320.

Referring to FIG. 14, an integrated circuit 1400 is formed in and on a p-type semiconductor substrate 1402 as described in reference to FIG. 2A. Field oxide 1404 is disposed at a top surface of the substrate 1402 as described in reference to FIG. 1 and FIG. 2A. The voltage protection structure 1406 includes a diode 1408 which includes a first diode portion 1410, a second diode portion 1412, a third diode portion 1414 and a fourth diode portion 1416. The voltage protection structure 1406 also includes a guard element 1418 which includes a first guard element portion 1420, a second guard element portion 1422, a third guard element portion 1424 and a fourth guard element portion 1426. The voltage protection structure 1406 further includes a DENMOS transistor 1428 which has a closed-loop configuration.

In the instant embodiment, the first guard element portion 1420, the second guard element portion 1422, the third guard element portion 1424 and the fourth guard element portion 1426 are disposed adjacent to the DENMOS transistor 1428 so as to surround the DENMOS transistor 1428. The first guard element portion 1420 is disposed proximate to ends of the second guard element portion 1422 and the fourth guard element portion 1426, and opposite from the third guard element portion 1424. The second guard element portion 1422 is disposed proximate to ends of the first guard element portion 1420 and the third guard element portion 1424, and opposite from the fourth guard element portion 1426.

The first diode portion 1410 is disposed adjacent to the first guard element portion 1420 opposite from the DENMOS transistor 1428. Similarly, the second diode portion 1412 is disposed adjacent to the second guard element portion 1422 opposite from the DENMOS transistor 1428, the third diode portion 1414 is disposed adjacent to the third guard element portion 1424 opposite from the DENMOS transistor 1428, and the fourth diode portion 1416 is disposed adjacent to the fourth guard element portion 1426 opposite from the DENMOS transistor 1428.

A first anode active area portion 1430 of the first diode portion 1410, a second anode active area portion 1432 of the second diode portion 1412, a third anode active area portion 1434 of the third diode portion 1414 and a fourth anode active area portion 1436 of the fourth diode portion 1416 are electrically connected to an I/O pad of the integrated circuit 1400. A first cathode active area portion 1438 of the first diode portion 1410, a second cathode active area portion 1440 of the second diode portion 1412, a third cathode active area portion 1442 of the third diode portion 1414 and a fourth cathode active area portion 1444 of the fourth diode portion 1416 are electrically connected to a central drain contact active area 1446 of the DENMOS transistor 1428.

A first guard element active area 1448 of the first guard element portion 1420, a second guard element active area 1450 of the second guard element portion 1422, a third guard element active area 1452 of the third guard element portion 1424, and a fourth guard element active area 1454 of the fourth guard element portion 1426 are coupled to at least one instance of a ground node of the integrated circuit 1400. In one version of the instant embodiment, the first guard element active area 1448, the second guard element active area 1450, the third guard element active area 1452, and the fourth guard element active area 1454 may be coupled to the ground node independently of each other. In another version, the first guard element active area 1448, the second guard element active area 1450, the third guard element active area 1452, and the fourth guard element active area 1454 may be coupled to the ground node through a common voltage dropping element such as a resistor.

Configuring the voltage protection structure 1406 to have the DENMOS transistor 1428 to have the closed loop configuration and to have the first diode portion 1410, the second diode portion 1412, the third diode portion 1414 and the fourth diode portion 1416 surrounding the DENMOS transistor 1320, and to have the first guard element portion 1420, the second guard element portion 1422, the third guard element portion 1424 and the fourth guard element portion 1426 disposed between the DENMOS transistor 1320 and the first diode portion 1410, the second diode portion 1412, the third diode portion 1414 and the fourth diode portion 1416, respectively, may advantageously provide an increased current density in the DENMOS transistor 1428.

Figure 15:
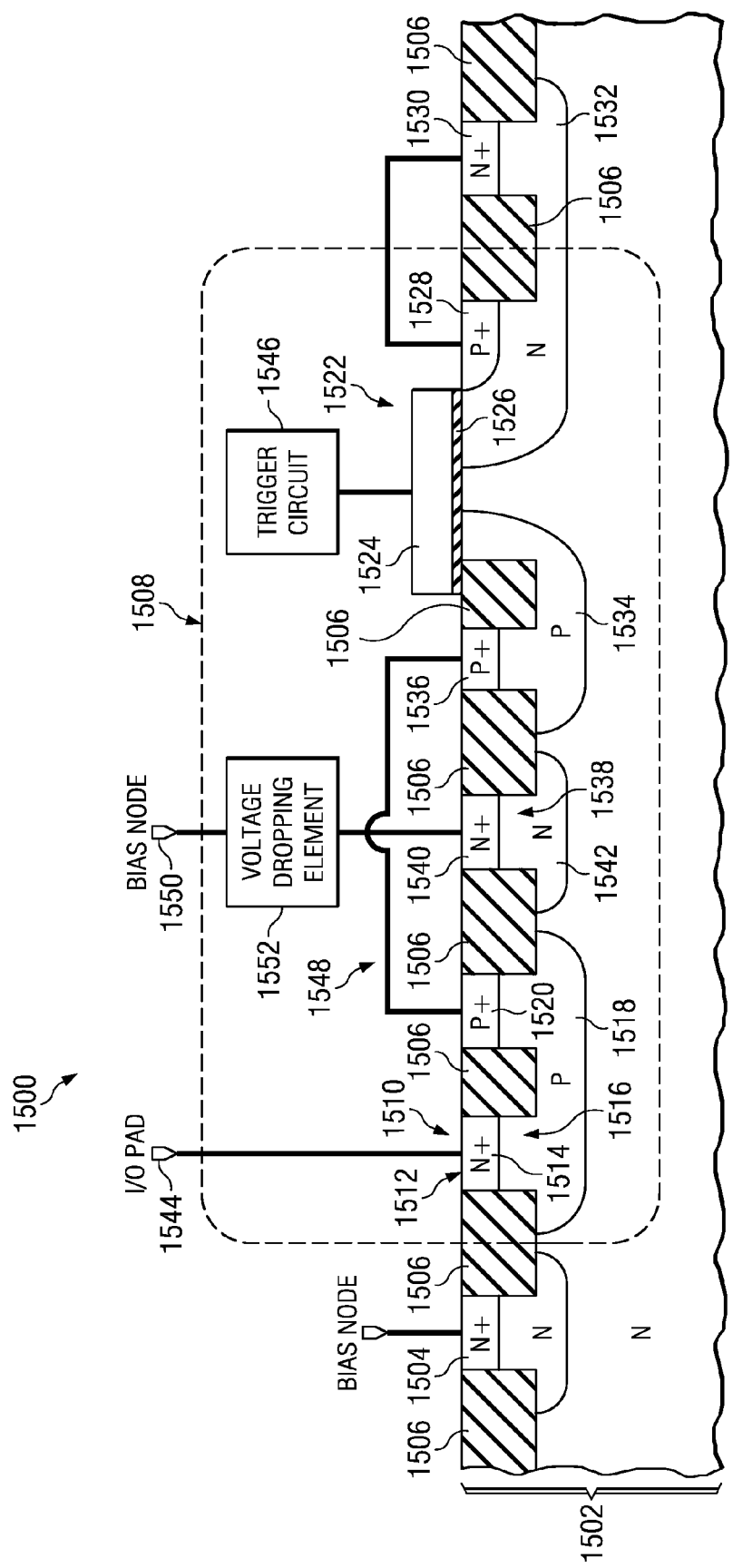
FIG. 15 is a cross-section of an integrated circuit containing a voltage protection structure of an opposite polarity, according to an embodiment.

FIG. 15 is a cross-section of an integrated circuit containing a voltage protection structure of an opposite polarity, according to an embodiment. The integrated circuit 1500 is disposed in and on an n-type semiconductor substrate 1502, possibly a single crystal silicon wafer, a n-type epitaxial layer, or a deep n-type well in a p-type wafer. The substrate 1502 is connected to a bias node of the integrated circuit 1500 such as ground or Vdd, for example through a substrate contact active area 1504. Field oxide elements 1506 are disposed at a top surface of the substrate 1502 to laterally isolate active areas of the integrated circuit 1500. The voltage protection structure 1508 includes a diode 1510 having a cathode 1512, for example an n-type cathode active area 1514, and an anode 1516, for example a p-type anode well 1518 containing the n-type cathode active area 1514. The anode 1516 may include a p-type anode contact active area 1520.

The voltage protection structure 1508 further includes a drain extended p-channel metal oxide semiconductor (DEPMOS) transistor 1522 with a gate 1524 disposed over a gate dielectric layer 1526 on the substrate 1502. A p-type source active area 1528 of the DEPMOS transistor 1522 is disposed adjacent to the gate 1524 and is connected to the substrate 1502, for example through an n-type substrate contact active area 1530. The source active area 1528 may be disposed in an n-type body well 1532 which is in electrical contact with the substrate 1502. A p-type drain drift region 1534 of the DEPMOS transistor 1522 is disposed in the substrate 1502. The drain drift region 1534 extends under the gate 1524 opposite from the source active area 1528. A p-type drain contact active area 1536 is disposed in the drain drift region 1534 laterally separated from the gate 1524, for example by an element of field oxide 1506.

An n-type guard element 1538 which may include, for example, an n-type guard element active area 1540 in an optional n-type guard element well 1542, is disposed in the substrate 1502 proximate to the diode 1510 and the DEPMOS transistor 1522, preferably between the anode 1516 and the DEPMOS body well 1532.

The diode anode 1516 may be connected to an I/O pad 1544 of the integrated circuit 1500. The DEPMOS gate 1524, in one example, may be connected to a trigger circuit 1546 as depicted in FIG. 15, or, in another example, may be directly connected to the substrate 1502. The DEPMOS drain contact active area 1536 is electrically connected to the diode anode 1516, as indicated schematically in FIG. 15 by a drain-anode link 1548. The DEPMOS drain contact active area 1536 may be connected to the diode anode 1516, for example, through metal interconnection elements of the integrated circuit 1500, possibly through the anode contact active area 1520, or through a p-type active area disposed in the substrate 1502. The guard element 1538 is coupled to a bias terminal 1550 of the integrated circuit 1500, optionally through a voltage dropping element 1552. The voltage dropping element 1552 may be, for example, a resistor, transistor, diode array, or a resistive portion of the guard element 1538.

It will be recognized that features described in reference to one embodiment may be used with other features described in reference to another embodiment. For example, the guard element resistor 528 described in reference to FIG. 5 may be used with the guard element 410 described in reference to FIG. 4. In another example, the DENMOS transistor 1428 described in reference to FIG. 14 may be used with the guard element 610 described in reference to FIG. 6.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. An integrated circuit, comprising:
a p-type semiconductor substrate;
a diode disposed in said substrate, said diode including:
  an anode connected to an input/output (I/O) pad of said integrated circuit, said anode including a p-type anode active area; and
  a cathode, said cathode including an n-type cathode well containing said anode active area;
a drain extended n-channel metal oxide semiconductor (DENMOS) transistor proximate to said diode, said DENMOS transistor including:
  a gate dielectric layer disposed over said substrate;
  a gate disposed over said gate dielectric layer;
  an n-type source active area disposed in said substrate adjacent to said gate, said source active area being connected to a ground node of said integrated circuit;
  an n-type drain drift region disposed in said substrate, said drain drift region extending under said gate opposite from said source active area; and
  an n-type drain contact active area disposed in said drain drift region, said drain contact active area being laterally separated from said gate, said drain contact active area being electrically connected to said diode cathode; and
a guard element disposed proximate to said diode and to said DENMOS transistor, said guard element including a p-type guard element active area disposed in said sub- strate, said guard element active area being electrically coupled to an instance of a ground node of said integrated circuit.

2. The integrated circuit of claim 1, in which said guard element further includes a p-type guard element well disposed in said substrate, said guard element well containing said guard element active area.

3. The integrated circuit of claim 1, in which said guard element active area is segmented.

4. The integrated circuit of claim 1, in which said guard element active area surrounds said diode.

5. The integrated circuit of claim 1, in which said guard element active area surrounds said DENMOS transistor.

6. The integrated circuit of claim 1, in which said guard element active area is coupled to said ground node through a guard element resistor.

7. The integrated circuit of claim 6, in which said guard element resistor is formed in a p-type active area.

8. The integrated circuit of claim 6, in which said guard element resistor includes a resistor element of polysilicon.

9. The integrated circuit of claim 6, in which said guard element resistor includes a transistor.

10. The integrated circuit of claim 1, in which said anode includes a compensated p-type well disposed in said n-type cathode well.

11. The integrated circuit of claim 1, in which:
said guard element includes:
    a first guard element portion disposed adjacent to said DENMOS transistor; and
    a second guard element portion disposed adjacent to said DENMOS transistor opposite from said first guard element portion; and
said diode includes:
    a first diode portion disposed adjacent to said first guard element portion opposite from said DENMOS transistor, said first diode portion including a first anode active area portion and a first cathode active area portion, said first anode active area portion being electrically connected to said I/O pad, and said first cathode active area portion being electrically connected to said drain contact active area; and
    a second diode portion disposed adjacent to said second guard element portion opposite from said DENMOS transistor, said second diode portion including a second anode active area portion and a second cathode active area portion, said second anode active area portion being electrically connected to said I/O pad, and said second cathode active area portion being electrically connected to said drain contact active area.

12. The integrated circuit of claim 1, in which:
said guard element includes a first guard element portion, a second guard element portion, a third guard element portion and a fourth guard element portion, said guard element portions disposed adjacent to said DENMOS transistor so as to surround said DENMOS transistor, such that said first guard element portion is disposed proximate to ends of said second guard element portion and said fourth guard element portion, opposite from said third guard element portion, and said second guard element portion is disposed proximate to ends of said first guard element portion and said third guard element portion, opposite from said fourth guard element portion;
said diode includes:
    a first diode portion, such that said first diode portion is disposed adjacent to said first guard element portion opposite from said DENMOS transistor, said first diode portion including a first anode active area portion and a first cathode active area portion, said first anode active area portion being electrically connected to said I/O pad, and said first cathode active area portion being electrically connected to said drain contact active area;
    a second diode portion, such that said second diode portion is disposed adjacent to said second guard element portion opposite from said DENMOS transistor, said second diode portion including a second anode active area portion and a second cathode active area portion, said second anode active area portion being electrically connected to said I/O pad, and said second cathode active area portion being electrically connected to said drain contact active area;
    a third diode portion, such that said third diode portion is disposed adjacent to said third guard element portion opposite from said DENMOS transistor, said third diode portion including a third anode active area portion and a third cathode active area portion, said third anode active area portion being electrically connected to said I/O pad, and said third cathode active area portion being electrically connected to said drain contact active area; and
    a fourth diode portion, such that said fourth diode portion is disposed adjacent to said fourth guard element portion opposite from said DENMOS transistor, said fourth diode portion including a fourth anode active area portion and a fourth cathode active area portion, said fourth anode active area portion being electrically connected to said I/O pad, and said fourth cathode active area portion being electrically connected to said drain contact active area.

13. The integrated circuit of claim 1, in which said DENMOS transistor has a linear configuration.

14. The integrated circuit of claim 1, in which said DENMOS transistor includes a plurality of linear gate portions disposed in a linear array.

15. The integrated circuit of claim 1, in which said DENMOS transistor has a closed loop configuration, such that said drain contact active area is a central drain contact active area.

16. The integrated circuit of claim 1, in which said gate of said DENMOS transistor is coupled to said I/O pad through a capacitor and is coupled to an instance of said ground node through a resistor.

17. The integrated circuit of claim 1, in which said gate of said DENMOS transistor is coupled to said I/O pad through a zener diode and is coupled to an instance of said ground node through a resistor.

18. The integrated circuit of claim 1, in which said drain contact active area is electrically connected to said diode cathode through an n-type active area.

19. An integrated circuit, comprising:
an n-type semiconductor substrate;
a diode disposed in said substrate, said diode including:
    a cathode connected to an input/output (I/O) pad of said integrated circuit, said cathode including an n-type anode active area; and
    an anode, said anode including a p-type cathode well containing said cathode active area;
a drain extended p-channel metal oxide semiconductor (DEPMOS) transistor proximate to said diode, said DEPMOS transistor including:
    a gate dielectric layer disposed over said substrate;
    a gate disposed over said gate dielectric layer;

a p-type source active area disposed in said substrate adjacent to said gate, said source active area being connected to a ground node of said integrated circuit;

a p-type drain drift region disposed in said substrate, said drain drift region extending under said gate opposite from said source active area; and a p-type drain contact active area disposed in said drain drift region, said drain contact active area being laterally separated from said gate, said drain contact active area being electrically connected to said diode anode; and a guard element disposed proximate to said diode and to said DEPMOS transistor, said guard element including an n-type guard element active area disposed in said substrate, said guard element active area being electrically coupled to an instance of a ground node of said integrated circuit.

* * * * *